United States Patent
Kang et al.

(10) Patent No.: US 7,408,015 B2
(45) Date of Patent: Aug. 5, 2008

(54) REACTING FUNCTIONALIZED TRIALKOXYSILANE WITH POLYEPOXIDE OR DIAMINE TO YIELD SILANE ADDUCT

(75) Inventors: Byoung Un Kang, Gyeonggi-do (KR); Hyuk Soo Moon, Gyeonggi-do (KR); Jong Kul Lee, Gyeonggi-do (KR); Kyoung Tae Wi, Seoul (KR); Tae Sung Kim, Gyeonggi-do (KR)

(73) Assignee: LG Cable, Ltd (KR)

( * ) Notice: Subject to any disclaimer, the term of this patent is extended or adjusted under 35 U.S.C. 154(b) by 428 days.

(21) Appl. No.: 11/311,198

(22) Filed: Dec. 19, 2005

(65) Prior Publication Data
US 2006/0094848 A1    May 4, 2006

Related U.S. Application Data

(62) Division of application No. 10/652,667, filed on Aug. 29, 2003, now Pat. No. 7,105,625.

(30) Foreign Application Priority Data
May 1, 2003    (KR) .................. 10-2003-0028034

(51) Int. Cl.
*C07F 7/08* (2006.01)
*C07F 7/10* (2006.01)
*C08G 59/14* (2006.01)

(52) U.S. Cl. ............... 528/111; 528/109; 528/110; 556/413; 556/414; 556/415; 556/427; 556/465

(58) Field of Classification Search .............. None
See application file for complete search history.

(56) References Cited

FOREIGN PATENT DOCUMENTS

| JP | 06-256358 | 9/1994 |
| JP | 06-293784 | 10/1994 |
| JP | 06-322220 | 11/1994 |
| JP | 07-070285 | 3/1995 |

*Primary Examiner*—Robert Sellers
(74) *Attorney, Agent, or Firm*—Vidas, Arrett & Steinkraus

(57) ABSTRACT

The present invention relates to silane adducts having a relatively higher adhesive strength as expressed formula $X_3SiR^1$, and manufacturing method thereof. wherein X is a hydrogenated form selected from one of epoxy compounds, amino compounds and bisphenolic, and $R^1$ is selected from one of glycidyloxypropyl group, 2-(3,4-epoxycyclohexyl)ethyl group, 3-acryloxypropyl group, 3-methacryloxypropyl group, amino-propyl group, 3-[2-(2-aminoethylamino)ethylamino]propyl group, N-methylaminopropyl group, N-phenylaminopropyl group, N,N-dimethyl-3-aminopropyl group, mercapto-propyl group, cyano-propyl group, and isocyanato-propyl group.

9 Claims, 1 Drawing Sheet

REACTING FUNCTIONALIZED TRIALKOXYSILANE WITH POLYEPOXIDE OR DIAMINE TO YIELD SILANE ADDUCT

This is a divisional of application Ser. No. 10/652,667 filed Aug. 29, 2003, U.S. Pat. No. 7,105,625.

BACKGROUND OF THE INVENTION

1. Field of the Invention

The present invention relates to silane adducts used as coupling agents which adhere inorganics like metal, glass or ceramic to organic adhesives like epoxy resin, polyimide resin, polyimide-siloxane resin, and siloxane resin used in the field of semiconductor package of Board-On-Chip (BOC), and Chip Scale Package (CSP) installed on electronic devices, cellular phone and computers, etc. More specifically, the present invention relates to silane adducts having a relatively higher adhesive strength as expressed formula 1, and manufacturing method thereof.

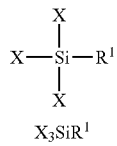

[Formula 1]

$X_3SiR^1$ wherein X is a dehydrogenated form selected from one of epoxy compounds, amino compounds, and bisphenolics, and $R^1$ is a organoalkyl group, which is one of the functional group selected among glycidyloxypropyl group, 2-(3,4-epoxycyclohexyl)ethyl- group, 3-acryloxypropyl group, 3-methacryloxypropyl group, amino-propyl group, 3-[2-(2-aminoethylamino)ethylamino]propyl group, N-methylaminopropyl group, N-phenylaminopropyl group, N,N-dimethyl-3-aminopropyl group, mercapto-propyl group, cyano-propyl group, and isocyanato-propyl group.

2. Description of the Background Art

Conventional silane coupling agent as expressed formula 2 is used as coupling agents which adhered inorganics like metal, glass or ceramic to organic adhesives like epoxy resin, polyimide resin, polyimide-siloxane resin, and siloxane resin used in the field of semiconductor package of Board-On-Chip (BOC), and Chip Scale Package (CSP) installed on electronic devices, cellular phone, computer, semiconductor material like BOC, and CSP

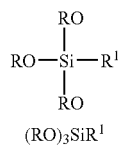

[Formula 2]

$(RO)_3SiR^1$ wherein, R is methyl or ethyl group. $R^1$ is selected from one of glycidyloxypropyl group, 2-(3,4-epoxycyclohexyl)ethyl group, 3-acryloxypropyl group, 3-methacryloxypropyl group, amino-propyl group, 3-[2-(2-aminoethylamino)ethylamino]propyl group, N-methylaminopropyl group, N-phenylaminopropyl group, N,N-dimethyl-3-aminopropyl group, mercapto-propyl group, cyano-propyl group, and isocyanato-propyl group, which has a reactivity or a compatibility with polymeric materials.

More details, for the purpose that the silane coupling agent as expressed formula 2 couples inorganic material to organic materials, the RO— group of the conventional silane coupling agent as expressed formula 2 must be transformed into silanol group, —SiOH, as expressed formula 3 by hydrolysis process as shown in reaction 1.

Silanol group of formula 3 formed by hydrolysis chemically reacted to inorganic materials, and $R^1$ group can be chemically coupled to other organic materials. From the reaction, the bond between organic adhesives and inorganics will be strengthened.

$(RO)_3SiR^1 + H_2O \rightarrow (HO)_3SiR^1 + 3R\text{—}OH$      [Reaction 1]

[Formula 3]

$(HO)_3SiR^1$ wherein R and $R^1$ are the same as those of formula 2, and R—OH is organic by-product with low molecule. Because R—OH is a volatile organic compound, it is desirable to minimize the by-product for safety and environmental cause.

In general, there are three methods of Solution, Dry-blend, and Integral blend to adapt the conventional silane compounds and then to bond between organic adhesive and inorganics. The details are shown below:

1) Solution Method:

It is used to make compounds of formula 3 with silanol group through hydrolysis of RO— group as shown in reaction 1 by adding silane coupling agent to alcohol/water co-solvent. This process takes an hour and it is very important to properly control pH of the solution.

2) Dry Blend Method:

It is a method that silane compounds without hydrolysis are directly added or silane compounds blended with solvent are added into mineral fillers, before impregnating the fillers to resin.

However, it has the disadvantage that the silane compound is not uniformly wetted over the filler.

3) Integral Blend Method:

This method is to directly add the silane coupling agent without treatment by hydrolysis to a polymeric phase etc. and then to diffuse the silane coupling agent on the surface of fillers uniformly dispersed in polymer resin. This method is used in the case that the above two methods are difficult to adopt. Its result is, however, less effective than the above two methods 1) and 2) which are directly wetted on surface of fillers.

In the case where the silane coupling agent is applied to the organic die attach adhesive so that chips as inorganic material are connected with substrates as electrical path in Board-On-Chip (BOC) or Chip-Scale-Package (CSP) of semiconductor, the solution method and the dry blend method can not be used because the surfaces of the chip and the substrate cannot be directly treated with silane coupling agent. For that purpose, the integral blend method directly adding the silane coupling agent to the adhesive should be used.

However, if the integral blend method is used in order that the general silane coupling agent is added into the adhesive applied to BOC or CSP, R—OH group generated by hydrolysis forms void on the interface between the die attach adhesive and metal or chip. The void trapped on the interface may give rise to incomplete wetting, which inevitably leads to a decrease of the adhesive strength when external thermal or mechanical stress is applied thereto. Therefore, the adhesive with the conventional silane coupling agent is very difficult to use for adhesion of package like BOC and CSP for semiconductors.

SUMMARY OF THE INVENTION

Accordingly, in order to overcome the above problems and be applied to Board-On-Chip (BOC) or Chip-Scale-Package (CSP), it is an objective of the present invention to provide a silane adduct with relatively higher adhesion strength and effective process, and void-free characteristics as expressed formula 1, and manufacturing method thereof and method of coupling organic die attach adhesive with inorganic materials using the same.

[Formula 1]

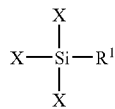

wherein, X is a dehydrogenated form selected from one of epoxy compounds, amino compounds and bisphenolics. Here, (a) the epoxy compounds above is selected one of diglycidyl ether of bisphenol A (Mn=380~50,000), diglycidyl ether of bisphenol F (Mn=340~4,000), phenol-novolac epoxy, o-cresol novolac epoxy, bisphenol A-novolac epoxy and diglycidyl terephthalate.

(b) The amino compounds is selected from one of imidazole, piperidine, dicyandiamide, 4,4,'-diaminodiphenylsulfone (DDS), 4,4'-diaminodiphenylmethane (DDM), 4,4'-diaminodiphenylpropane, 4,4'-oxydianiline, 1,4-cyclohexanediamine, hexamethylenediamine, heptamethylenediamine, nonamethylenediamine, decamethylenediamine, 2,4-diaminotoluene, and 2,6-diaminotoluene.

(c) The bisphenolics is selected from one of 4,4'-isopropylidene diphenol, 4,4'-isopropylidenebis (2,6-dimethyl phenol), 4,4'-ethylidenebisphenol, Bis(4-hydroxyphenyl)methane, 4,4'-(1,3-phenylenediisopropylidene)bisphenol, 4,4'-(1,4-phenylenedi-isopropylidene)bisphenol, 4,4'-Sulfonyldiphenol, 4,4'-cyclohexylidene bisphenol, and bis(4-hydroxyphenyl)-2,2-dichloroethylene.

$R^1$ is a organoalkyl group, which is one of the functional group selected among glycidyloxypropyl group, 2-(3,4-epoxycyclohexyl)ethyl group, 3-acryloxypropyl group, 3-methacryloxypropyl group, amino-propyl group, 3-[2-(2-aminoethylamino)ethylamino]propyl group, N-methylaminopropyl group, N-phenylaminopropyl group, N,N-dimethyl-3-aminopropyl group, mercapto-propyl group, cyano-propyl group, and isocyanato-propyl group.

The silane addcuct as expressed formula 1 can be synthesized through reaction 2.

$(RO)_3SiR^1 + 3X \rightarrow X_3SiR^1 + 3R\text{—}OH$     [Reaction 2]

wherein, X is selected from one of epoxy compounds, amino compounds and bisphenolics. Here, (a) the epoxy compounds above is selected one of diglycidyl ether of bisphenol A (Mn=380~50,000), diglycidyl ether of bisphenol F (Mn=340~4,000), phenol-novolac epoxy, o-cresol novolac epoxy, bisphenol A-novolac epoxy and diglycidyl terephthalate.

(b) The amino compounds is selected from one of imidazole, piperidine, dicyandiamide, 4,4,'-diaminodiphenylsulfone (DDS), 4,4'-diaminodiphenylmethane (DDM), 4,4'-diaminodiphenylpropane, 4,4'-oxydianiline, 1,4-cyclohexanediamine, hexamethylenediamine, heptamethylenediamine, nonamethylenediamine, decamethylenediamine, 2,4-diaminotoluene, and 2,6-diaminotoluene.

(c) The bisphenolics is selected from one of 4,4'-isopropylidene diphenol, 4,4'-isopropylidenebis (2,6-dimethyl phenol), 4,4'-ethylidenebisphenol, Bis(4-hydroxyphenyl)methane, 4,4'-(1,3-phenylenediisopropylidene)bisphenol, 4,4'-(1,4-phenylenedi-isopropylidene)bisphenol, 4,4'-Sulfonyldiphenol, 4,4'-cyclohexylidene bisphenol, and bis(4-hydroxyphenyl)-2,2-dichloroethylene.

Wherein R and $R^1$ are the same as those of formula 1.

DETAILED DESCRIPTION OF THE PREFERRED EMBODIMENTS

Figure 1:
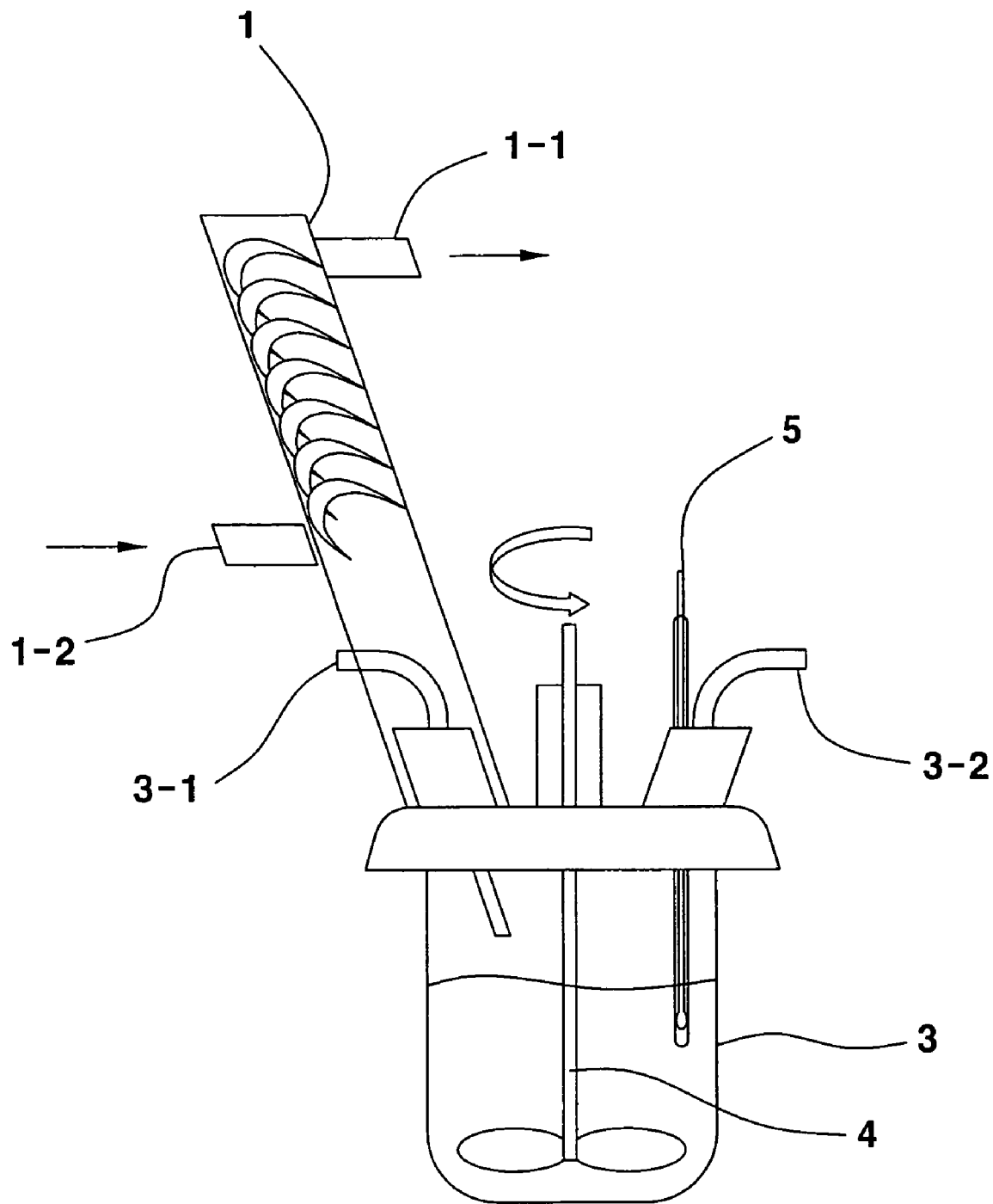
FIG. 1 is a schematic view illustrating a reactor for forming the silane adduct according to the present invention.

The detailed explanation of the silane adduct according the present invention and the manufacturing method thereof as follows:

First of all, the silane adduct of the present invention is expressed by formula

[Formula 1]

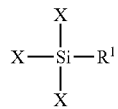

wherein, X is a dehydrogenated form selected from one of epoxy compounds, amino compounds and bisphenolics.

(a) The epoxy compounds is selected from one of diglycidyl ether of bisphenol A (Mn=380~50,000), diglycidyl ether of bisphenol F (Mn=340~4,000), phenol-novolac epoxy, o-cresol novolac epoxy, bisphenol A-novolac epoxy and diglycidyl terephthalate.

(b) The amino compounds is selected from one of imidazole, piperidine, dicyandiamide, 4,4,'-diaminodiphenylsulfone (DDS), 4,4'-diaminodiphenylmethane (DDM), 4,4'-diaminodiphenylpropane, 4,4'-oxydianiline, 1,4-cyclohexanediamine, hexamethylenediamine, heptamethylenediamine, nonamethylenediamine, decamethylenediamine, 2,4-diaminotoluene, and 2,6-diaminotoluene.

(c) The bisphenolics is selected from one of 4,4'-isopropylidene diphenol, 4,4'-isopropylidenebis (2,6-dimethyl phenol), 4,4'-ethylidenebisphenol, Bis(4-hydroxyphenyl)methane, 4,4'-(1,3-phenylenediisopropylidene)bisphenol, 4,4'-(1,4-phenylenedi-isopropylidene)bisphenol, 4,4'-Sulfonyldiphenol, 4,4'-cyclohexylidene bisphenol, and bis(4-hydroxyphenyl)-2,2-dichloroethylene.

$R^1$ is selected from one of glycidyloxypropyl group, 2-(3,4-epoxycyclohexyl)ethyl group, 3-acryloxypropyl group, 3-methacryloxypropyl group, amino-propyl group, 3-[2-(2-aminoethylamino)ethylamino]propyl group, N-methylaminopropyl group, N-phenylaminopropyl group, N,N-dimethyl-3-aminopropyl group, mercapto-propyl group, cyano-propyl group, and isocyanato-propyl group.

The X group is physically adsorbed or chemically reacted to the inorganic materials and the $R^1$ group is chemically coupled to other organic compounds, thereby the organic adhesive and inorganic materials are coupled each other.

In the silane adduct of the present invention, RO group of the conventional silane coupling agent is replaced with X group. Therefore, the silane adduct of present invention can couple to the inorganic materials without hydrolysis. Also, since it can directly apply to an organic adhesive used in the electrical materials, it does not cause any boundary surface void. In contrast, in the prior art, the boundary surface void was essentially generated by lower molecule, R—OH, formed by hydrolysis process of the conventional silane coupling agent. In other words, the present invention does not need the hydrolysis process for the silane adduct, and does not generate the lower molecule materials not functioning adhesive reaction and rather degrading the boundary surface characteristics. Instead, the silane adduct of the present invention has a characteristics of relatively higher adhesion.

Next, the manufacturing method of the silane adduct mentioned above will be explained below.

The silane addcuct as expressed formula 1 can be synthesized through reaction 2.

  [Reaction 2]

wherein, X is selected from one of epoxy compounds, amino compounds and bisphenolics. Here, (a) the epoxy compounds above is selected one of diglycidyl ether of bisphenol A (Mn=380~50,000), diglycidyl ether of bisphenol F (Mn=340~4,000), phenol-novolac epoxy, o-cresol novolac epoxy, bisphenol A-novolac epoxy and diglycidyl terephthalate.

(b) The amino compounds is selected from one of imidazole, piperidine, dicyandiamide, 4,4,'-diaminodiphenylsulfone (DDS), 4,4'-diaminodiphenylmethane (DDM), 4,4'-diaminodiphenylpropane, 4,4'-oxydianiline, 1,4-cyclohexanediamine, hexamethylenediamine, heptamethylenediamine, nonamethylenediamine, decamethylenediamine, 2,4-diaminotoluene, and 2,6-diaminotoluene.

(c) The bisphenolics is selected from one of 4,4'-isopropylidene diphenol, 4,4'-isopropylidenebis (2,6-dimethyl phenol), 4,4'-ethylidenebisphenol, Bis(4-hydroxyphenyl)methane, 4,4'-(1,3-phenylenediisopropylidene)bisphenol, 4,4'-(1,4-phenylenedi-isopropylidene)bisphenol, 4,4'-Sulfonyldiphenol, 4,4'-cyclohexylidene bisphenol, and bis(4-hydroxyphenyl)-2,2-dichloroethylene.

Wherein R and R$^1$ are the same as those of formula 1.

More details, in the reactor as shown in FIG. 1, organic material X of 50~500 weight %, triphenylphosphine of 0.1~5 weight %, and the silane coupling agent of 10~100 weight % as expressed formula 2 are added to a solvent of 200~5000 ml which is selected from one of water/ethanol co-solvent of 5:95 to 20:80 weight %, ethanol, toluene, n-hexane, methylene chloride, chloroform, trichloroethan, tetrachloroethane, N,N-dimethylformamide (DMF), N,N-dimethylacetamide (DMAc), and dimethyl sulfoxide (DMSO), and to react each other, thereby producing the silane adduct. Then, it is reacted in a bath maintaining its temperature 50~200° C. for 2~8 hours as mixed by a stirrer rotating with 100~500 rpm.

In the case that water/ethanol or ethanol is chosen as a solvent, it is desirable that an acetic acid of 0.01~0.5 weight % to 100 weight % solvent is added thereto.

Further, during reaction, the loss of solvent is minimized by reflux and a by-product like alcohols is continuously removed therefrom. Therefore, from the removal process of alcohol, the substitution reaction of RO to X group can be irreversibly maintained. After finishing the reaction, the solvent and remnant non-reacted substances are removed by a vacuum method.

In reactor shown in FIG. 1, number 1 among components is a condenser and 1-1 is an inlet line of water, 1-2 is an outlet line, 3-1 is an inject line of reactants, 3-2 is a line for vacuum, 4 is an impeller for stirring and 5 is a thermometer.

Embodiment 1

Adding 4,4'-isopropylidene diphenol (bisphenol A) of 30 g, (3-Aminopropyl)trimethoxysilane of 10 g, triphenylphosphine of 0.1 g to trichloroethane solution of 200 ml in the reactor dipped into the bath, which is maintained the temperature of 95° C.; reacting each other therein for two hours; cooling the solution under 50° C.; and removing remaining trichloroethane solution therefrom by a vacuum method.

Embodiment 2

Adding 4,4'-isopropylidene diphenol (bisphenol A) of 30 g, (glycidyloxy)trimethoxysilane of 10 g, triphenylphosphine of 0.1 g to trichloroethane solution of 200 ml in the reactor dipped into the bath, which is maintained the temperature of 95° C.; reacting each other therein for two hours; Cooling the solution under 50° C.; and removing remaining trichloroethane solution therefrom by a vacuum method.

Experimental Embodiment

The next experiment is tested for comparing the adhesion strength of the silane adduct of the present invention with that of the conventional silane coupling agent as shown below.

The comparison is that: cases of adding 1 g of the adducts produced respectively in embodiment 1 and embodiment 2 to a diglycidyl ether-Bisphenol A of 100 g, and cases of adding the unmodified form of (3-aminopropyl)trimethoxysilane, and (3-glycidyloxy)trimethoxysilane respectively to the same type of the epoxy above as a reference.

Commonly the formulation of the used adhesive has the following recipe:

| | |
|---|---|
| DGEBA epoxy (Mn = 380, Kukdo chemical) | 50 g |
| DGEBA epoxy (Mn = 975, Kukdo chemical) | 50 g |
| Dicyandiamide (DICY, Aldrich) | 4 g |
| Carboxyl terminated butadiene acrylonitrile copolymer (CTBN-13 , B F Goodrich) | 10 g |
| Modified Silane compound (Silane adduct) | 1 g |

After mixed each epoxy at 80° C. for 30 minutes, CTBN13 rubber is added thereto. Then, they are stirred for uniformly mixing with 200 rpm for 30 minutes, respectively. Next DICY and modified silane are injected thereto and at the same time they are stirred with 200 rpm for 30 minutes at 120° C. At the same time, bubbles generated during the reaction are removed therefrom by applying vacuum thereto. After that, a solution is coated on the substrates, electrolytic copper foil substrate (thickness=35 μm) and Upilex-S PI (thickness=50 μm) of organic materials, respectively, with the adhesive thickness of 50 μm by a doctor blade. After coating, the coated materials are cured at 175° C. for 1 hour and then compared their adhesion forces therewith. Here, the test for the adhesion force was adopted to ASTM D1876-72.

TABLE 1

| Code | Material | Peel strength (g/cm) | |
|------|----------|---------|----------|
|      |          | Cu foil | Upilex S |
| S1   | (3-aminopropyl)trimethoxysilane | 1220 | 810 |
| S2   | (glycidyloxy)trimethoxysilane | 1050 | 740 |
| MS1  | Modified silane (Embodiment 1) | 1840 | 1200 |
| MS2  | Modified silane (Embodiment 2) | 1530 | 1120 |

TABLE 2

| | Comparative peel strength | |
|---|---|---|
| | Cu foil | Upilex S |
| MS1/S1 | 1.58* | 1.48 |
| MS2/S2 | 1.46 | 1.51 |

*The value of more than 1 means that the modified silane is more effective to unmodified one.

Here, S1 and S2 stand for unmodified silanes in comparison embodiments 1 and 2, and MS1 and MS2 denote modified silanes in embodiments 1 and 2, respectively.

As shown in tables 1 and 2, the ratio of adhesion strength from the newly modified silane adducts in present invention (MS1, MS2) to that of unmodified silane couping agent (S1, S2) is greater than 1, more specifically 1.46. These results show that the adhesion strength of the modified silane adduct is higher than that of the unmodified silane adduct with respect to electrolytic copper foil as metal materials and PI as organic materials.

Therefore, the silane adduct of the present invention can effectively strengthen bonding between the inorganic materials and organic materials when compared with silane coupling agent of the prior art.

Moreover, the silane adduct of the present invention does not affect any environment problem since it does not produce low molecules not functioning adhesion. Also, when using as a component in an adhesive, since the silane adduct of the present invention does not produce any bubbles at the boundary surface between adherend, and thereby not cause any corrosion or weak boundary thereon, it can be applied to adhere various organic-inorganic materials.

What is claimed is:

1. A manufacturing method of a silane adduct as expressed formula 1 according to the reaction 2:

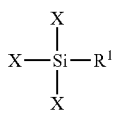
[Formula 1]

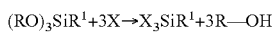
[reaction 2]

wherein, X is selected from the group consisting of epoxy compounds, amino compound and bisphenolics, (a) the epoxy compounds above is selected from the group consisting of diglycidyl ether of bisphenol A (Mn=380~50,000), diglycidyl ether of bisphenol F (Mn=340~4,000), phenol-novolac epoxy, o-cresol novolac epoxy, bisphenol A-novolac epoxy and diglycidyl terephthalate;

(b) The amino compound is selected from the group consisting of imidazole, piperidine, dicyandiamide, 4,4,'-diaminodiphenylsulfone(DDS),4,4'-diaminodiphenyl-methane (DDM), 4,4'-diaminodiphenylpropane, 4,4'-oxydianiline, 1,4-cyclohexanediamine, hexamethylenediamine, heptamethylenediamine, nonamethylenediamine, decamethylenediamine, 2,4-diaminotoluene, and 2,6-diaminotoluene;

(c) The bisphenolic is selected from the group consisting of 4,4'-isopropylidene diphenol, 4,4'-isopropylidenebis (2,6-dimethyl phenol), 4,4'-ethylidenebisphenol, Bis(4-hydroxyphenyl)methane, 4,4'-(1,3-phenylenediisopropylidene)bisphenol, 4,4'-(1,4-phenylenedi-isopropylidene)bisphenol, 4,4'-Sulfonyldiphenol, 4,4'-cyclohexylidene bisphenol, and bis(4-hydroxyphenyl)-2,2-dichloroethylene and;

$R^1$ is a organoalkyl group, which is one of the functional groups selected from the group consisting of glycidyloxypropyl group, 2-(3,4-epoxycyclohexyl)ethyl group, 3-acryloxypropyl group, 3-methacryloxypropyl group, amino-propyl group, 3-[2-(2-aminoethylamino)ethylamino]propyl group, N-methylaminopropyl group, N-phenylaminopropyl group, N, N-dimethyl-3-aminopropyl group, mercapto-propyl group, cyano-propyl group, and isocyanato-propyl group and;

R is a methyl or ethyl group.

2. A manufacturing method of a silane adduct as expressed formula 1 which is made by adding organic material X of 50 to 500 weight %, triphenylophosphine of 0.1 to 5 weight %, and a silane coupling agent of 10 to 100 weight % as expressed formula 2 to a solvent of 200 to 500 ml which is selected from the group consisting of water/ethanol co-solvent of 5:95 to 20:80 weight %, ethanol, toluene, n-hexane, methylene chloride, chloroform, trichloroethene, tetrachloroethene, N,N-dimethylformamide(DMF), N,N-dimethylacetamide(DMAc), and dimethyl sulfoxide(DMSO); and reacting the added materials;

[Formula 1]

[Formula 2]

$(RO)_3SiR^1$ wherein X is a dehydrogenated form selected from the group consisting of epoxy compounds, amino compounds and bisphenolics and;

$R^1$ is an organo-alkyl group selected from the group consisting of glycidyloxypropyl group, 2-(3,4-epoxycyclohexyl)ethyl group, 3-acryloxypropyl group, 3-methacryloxypropyl group, amino-propyl group, 3-[2-(2-aminoethylamino)ethylamino]propyl group, N-methylaminopropyl group, N-phenylaminopropyl group, N, N-dimethyl-3-aminopropyl group, mercaptopropyl group, cyano-propyl group, and isocyanato-propyl group and;

R is a methyl or ethyl group.

3. A manufacturing method of a silane adduct according to claim 2, wherein the epoxy compound is selected from the group consisting of diglycidyl ether of bisphenol A (Mn=380~50,000), diglycidyl ether of bisphenol F (Mn=340~4,000), phenol-novolac epoxy, o-cresol novolac epoxy, bisphenol A-novolac epoxy, and diglycidyl terephthalate.

4. A manufacturing method of a silane adduct according to claim 2, wherein the amino compound is selected from the group consisting of imidazole, piperidine, dicyandiamide, 4,4,'-diaminodiphenylsulfone(DDS), 4,4'-diaminodiphenylmethane(DDM), 4,4'-diaminodiphenylpropane, 4,4'-oxydianiline, 1,4-cyclohexanediamine, hexamethylenediamine, heptamethylenediamine, nonamethylenediamine, decamethylenediamine, 2,4-diaminotoluene, and 2,6-diaminotoluene.

5. A manufacturing method of a silane adduct according to claim 2, wherein the bisphenolic is selected from the group consisting of 4,4'-isopropylidene diphenol, 4,4'-isopropylidenebis(2,6-dimethyl phenol), 4,4'-ethylidenebisphenol, Bis(4-hydroxyphenyl)methane, 4,4'-(1,3-phenylenediisopropylidene)bisphenol, 4,4'-(1,4-phenylenedi-isopropylidene)bisphenol, 4,4'-Sulfonyldiphenol, 4,4'-cyclohexylidene bisphenol, and bis(4-hydroxyphenyl)-2,2-dichloroethylene.

6. A manufacturing method of a silane adduct according to claim 2, wherein the reaction is stirred with a speed of 100~500 rpm at 50~200° C. for 2~8 hours.

7. A manufacturing method of a silane adduct according to claim 6, wherein the reaction step further comprises continuously removing by-products produced as the reaction proceeds.

8. A manufacturing method of a silane adduct according to claim 6, further comprising refluxing the solution.

9. A manufacturing method of a silane adduct according to claim 2, wherein in the case that water/ethanol or ethanol is chosen as a solvent, an acetic acid of 0.01~0.5 weight % to 100 weight % solvent is added thereto.

* * * * *